(12) United States Patent
Fukada

(10) Patent No.: US 6,621,535 B1
(45) Date of Patent: Sep. 16, 2003

(54) SEMICONDUCTOR DEVICE AND METHOD OF MANUFACTURING THE SAME

(75) Inventor: Takeshi Fukada, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/296,042

(22) Filed: Apr. 21, 1999

(30) Foreign Application Priority Data

Apr. 24, 1998 (JP) .......................................... 10-131448

(51) Int. Cl.⁷ ................................................. G02F 1/136
(52) U.S. Cl. ........................................... 349/40; 349/122
(58) Field of Search ................................. 349/110, 111, 349/122, 138, 43, 40

(56) References Cited

U.S. PATENT DOCUMENTS

| | | | |
|---|---|---|---|
| 4,448,491 A | * | 5/1984 | Okubo |
| 5,101,288 A | * | 3/1992 | Ohta et al. |
| 5,176,791 A | | 1/1993 | Itoh et al. |
| 5,461,501 A | * | 10/1995 | Sato et al. ............ 349/42 |
| 5,536,950 A | * | 7/1996 | Liu et al. ............ 357/59 |
| 5,652,029 A | | 7/1997 | Itoh |
| 5,686,980 A | * | 11/1997 | Hirayama et al. ........ 349/110 |
| 5,706,067 A | * | 1/1998 | Colgan et al. ........... 349/114 |
| 5,724,107 A | * | 3/1998 | Nishikawa et al. ........ 349/38 |
| 5,766,696 A | | 6/1998 | Itoh |
| 5,784,201 A | * | 7/1998 | Lee et al. ............. 359/582 |
| 5,820,947 A | | 10/1998 | Itoh |
| 5,871,847 A | | 2/1999 | Itoh |
| 5,879,741 A | | 3/1999 | Itoh |
| 5,989,672 A | | 11/1999 | Hayashi |
| 6,001,431 A | | 12/1999 | Itoh et al. |
| 6,110,542 A | | 8/2000 | Miyanaga et al. |
| 6,115,090 A | | 9/2000 | Yamazaki |
| 6,163,055 A | | 12/2000 | Hirakata et al. |
| 6,165,582 A | | 12/2000 | Hayashi |
| 6,171,674 B1 | | 1/2001 | Yamazaki et al. |
| 6,183,816 B1 | | 2/2001 | Yamazaki et al. |
| 6,194,047 B1 | | 2/2001 | Hayashi |
| 6,207,281 B1 | | 3/2001 | Itoh |
| 6,217,661 B1 | | 4/2001 | Hirose et al. |
| 6,224,952 B1 | | 5/2001 | Itoh |
| 6,258,434 B1 | | 7/2001 | Hayashi |
| 6,261,634 B1 | | 7/2001 | Itoh |
| 6,265,070 B1 | | 7/2001 | Itoh |
| 6,423,383 B1 | | 7/2002 | Hirose et al. |
| 6,468,617 B1 | | 10/2002 | Yamazaki et al. |
| 2001/0018097 A1 | | 8/2001 | Itoh |

FOREIGN PATENT DOCUMENTS

| | | | |
|---|---|---|---|
| JP | 03-185425 | * | 8/1991 |
| JP | 03-072711 | | 11/1991 |
| JP | 04-027690 | | 5/1992 |
| JP | 04-027691 | | 5/1992 |
| JP | 10-268360 | | 10/1998 |
| JP | 11-52 | | 3/1999 |

* cited by examiner

Primary Examiner—Kenneth Parker
(74) Attorney, Agent, or Firm—Fish & Richardson P.C.

(57) ABSTRACT

There is provided a highly reliable semiconductor device in which electrostatic breakdown can be prevented. A diamond-like carbon (DLC) film is formed on a surface of an insulating substrate, and thereafter, a thin film transistor is formed on the insulating substrate. This DLC film allows charges of static electricity to flow and can prevent electrostatic breakdown of the thin film transistor.

64 Claims, 6 Drawing Sheets

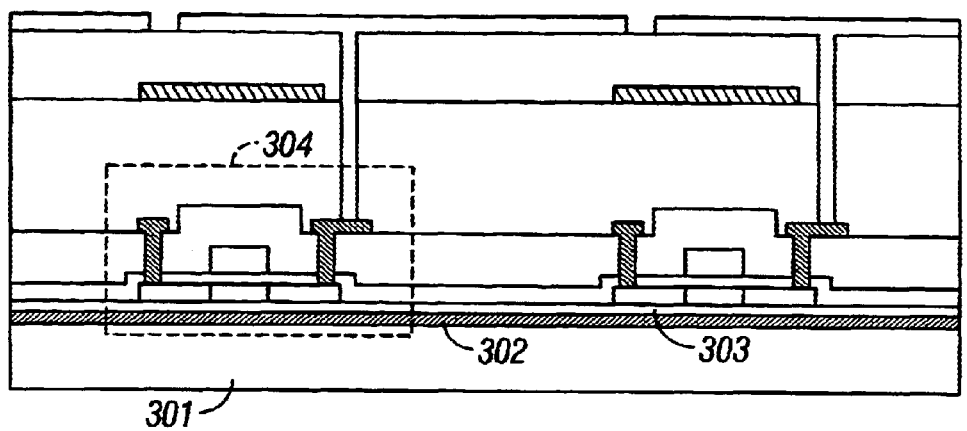
FIG. 3
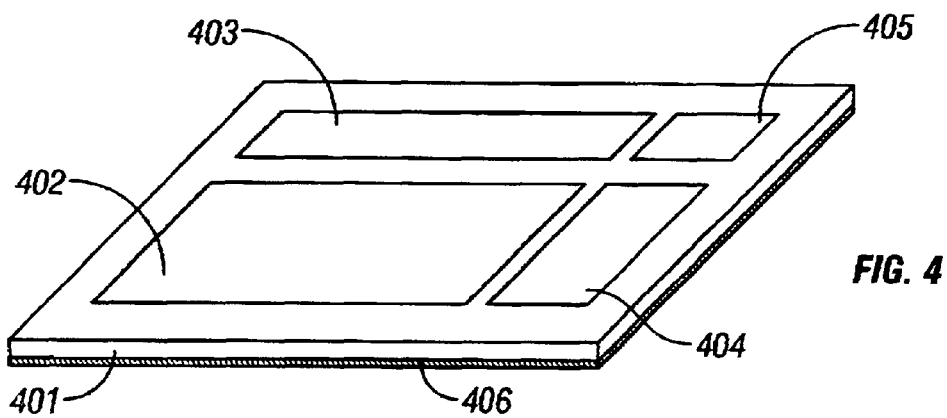
FIG. 4
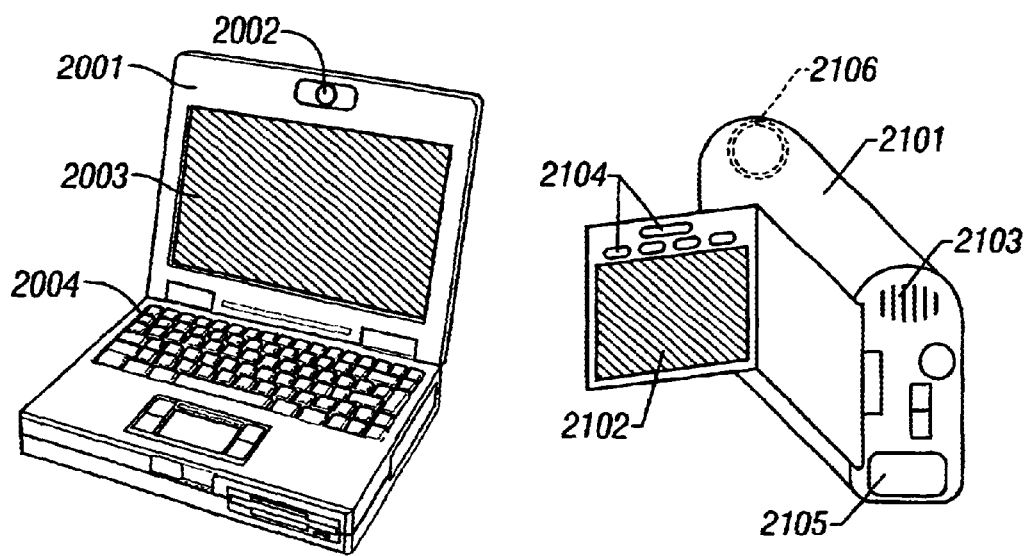
FIG. 5A
FIG. 5B

SEMICONDUCTOR DEVICE AND METHOD OF MANUFACTURING THE SAME

BACKGROUND OF THE INVENTION

1. Field of the Invention

The present invention relates to a structure of a semiconductor device including a thin film transistor (TFT) formed on a substrate and a method of manufacturing the same.

2. Description of the Related Art

A liquid crystal display (LCD) has attracted considerable attention as a picture display device that can replace with a CRT, because of such features as being thin in shape, light weight, and low consumption of electric power.

Among various kinds of liquid crystal displays, there is a TFT liquid crystal display (TFT-LCD). This is an active matrix driving type liquid crystal display in which a thin film transistor (TFT) is used as a switching element of a pixel.

In the active matrix type liquid crystal display, a number of TFTs disposed for each pixel are formed on an insulating substrate so that an active matrix circuit is constituted. In recent years, there is also proposed a display in which a driver circuit for driving an active matrix circuit is also formed on an insulating substrate. This driver circuit is also constituted by a number of elements such as TFTs.

Like this, a number of TFTs are formed on an insulating substrate in an active matrix type liquid crystal display, it is weak against static electricity. Charges of the static electricity are produced when the liquid crystal display is rubbed with a person or a thing, and that an insulating substrate takes the electrical charges.

The TFT, especially, is apt to be damaged by the retained charges of the static electricity. This is because its gate insulating film is as thin as 50 to 200 nm, so that if a high voltage is applied to the gate insulating film by the charges of the static electricity, breakdown is liable to be occurred. Moreover, since a large current flows through an active layer of the TFT by the charges of the static electricity, the active layer is degraded. In a worst case, the active layer is peeled off.

If the TFT is damaged, the pixel of the liquid crystal display keeps an on-state or off-state. As a result, a defect occurs in the display of the liquid crystal display.

Such electrostatic breakdown can occur not only during the use of the liquid crystal display but also during the manufacture of the liquid crystal display. During the manufacture, the static electricity is liable to be produced through contact with a person or a device.

SUMMARY OF THE INVENTION

An object of the present invention is therefore to prevent the foregoing electrostatic breakdown from occurring and to provide a highly reliable semiconductor device.

According to an aspect of the present invention, a semiconductor device is characterized by comprising a thin film transistor formed on an insulating surface of a substrate, and a diamond-like carbon film formed on the back surface of the substrate.

Here, the diamond-like carbon (DLC) is sometime called hard carbon or i-carbon, and is amorphous carbon mainly made from $sp^3$ bonds. However, depending on the manufacturing conditions, there is also a case where microcrystals of diamond are included therein.

According to another aspect of the present invention, a semiconductor device is characterized by comprising a diamond-like carbon film formed on an insulating substrate, an underlayer film formed on the diamond-like carbon film, and a thin film transistor formed on the underlayer film.

According to still another aspect of the present invention, a semiconductor device is characterized by comprising a thin film transistor formed on an insulating substrate, an interlayer insulating film formed on the thin film transistor, and a diamond-like carbon film formed on the interlayer insulating film.

According to still another aspect of the present invention, a method of manufacturing a semiconductor device comprises a step of forming a thin film transistor on an insulating surface of a substrate, and is characterized in that a diamond-like carbon film is formed on the back surface of the substrate.

According to still another aspect of the present invention, a method of manufacturing a semiconductor device is characterized by comprising the steps of: forming a diamond-like carbon film on an insulating substrate; forming an underlayer film on the diamond-like carbon film; and forming a thin film transistor on the underlayer film.

According to still another aspect of the present invention, a method of manufacturing a semiconductor device is characterized by s comprising the steps of: forming a thin film transistor on an insulating substrate; forming an interlayer insulating film covering the thin film transistor; and forming a diamond-like carbon film on the interlayer insulating film.

BRIEF DESCRIPTION OF THE DRAWINGS

In the accompanying drawings:

FIG. 3 is a view showing the structure of an active matrix circuit of the present invention;

FIG. 4 is a view showing the structure of a substrate including an active matrix circuit of the present invention and a driver circuit; and FIGS. 5A to 5F, 6A to 6D, 7A to 7C are views showing structures of electronic equipments.

DETAILED DESCRIPTION OF THE PREFERRED EMBODIMENTS

Figure 1A:
FIGS. 1A to 1C are views showing manufacturing steps of an active matrix circuit of the present invention.
Figure 1B:
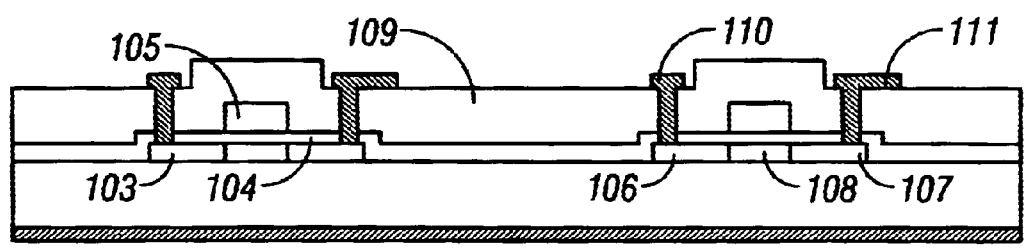

In FIG. 1, a diamond-like carbon film (hereinafter referred to as a DLC film) 102 is formed on the surface of an insulating substrate 101 (FIG. 1A). Then, a TFT is formed by a well-known method (FIG. 1B). Like this, as a film to prevent electrostatic breakdown from occurring, the DLC film is provided on a liquid crystal display.

The DLC film has a specific resistance of $10^7$ to $10^{14}$ $\Omega$cm which is smaller than that of a material (quartz, glass, etc.) having a specific resistance of $10^{16}$ to $10^{19}$ $\Omega$cm) to be used for the insulating substrate. Thus, the DLC film can free the substrate of the charges of static electricity and can prevent electrostatic breakdown of a gate insulating film 104 from occurring.

Since the DLC film is provided on the substrate before the TFT is formed, it is possible to prevent electrostatic breakdown from occurring not only during the use of the liquid crystal display but also during its manufacture.

Further, since the DLC film has Vickers hardness of 2,000 to 5,000 kgf/mm$^2$ and is hard, it also serves to protect the surface of the substrate.

In addition, the DLC film transmits visible light and infrared light. Therefore, the DLC film can be applied to a transmission type liquid crystal display in which light is transmitted to a substrate or liquid crystal so that a picture is displayed.

The present invention will be described in more detail in the following embodiments. Incidentally, although a top gate type TFT is shown in the respective embodiments, the effects of the present invention can also be obtained in a TFT of other structure.

Embodiment 1

Figure 1C:
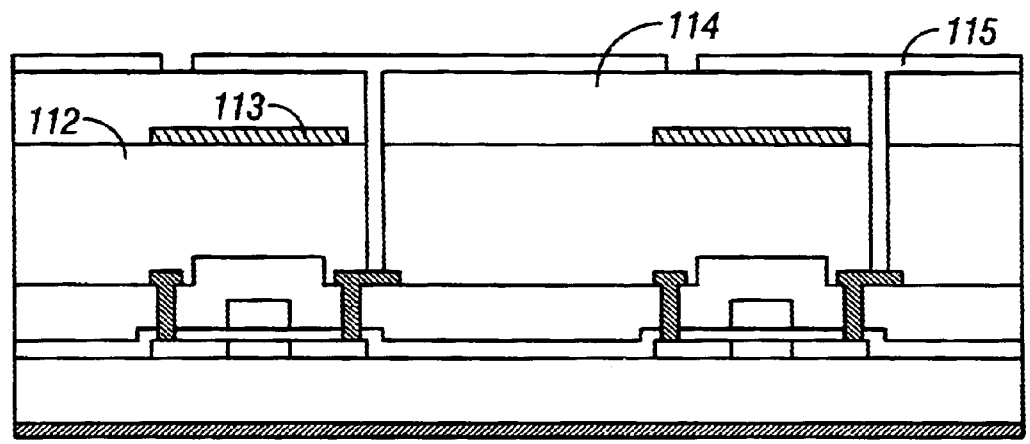

In this embodiment, the structure and manufacturing steps of a transmission type liquid crystal display of the present invention will be described with reference to FIGS. 1A to 1C. It should be noted that FIGS. 1A to 1C are sectional views of TFTs of an active matrix circuit.

In FIG. 1A, a DLC film 102 is formed on the surface of an insulating substrate 101. The details of a film forming method, film forming apparatus, and the like are disclosed in Japanese Examined Patent Publications Nos. Hei 3-72711, Hei 4-27690, and Hei 4-27691. An entire disclosure of the above apanese Examined Patent Publications is incorporated herein by reference.

It should be noted that, in this embodiment, since the transmission type liquid crystal display is manufactured, the DLC film must be transparent. However, although depending on film qualities, as the thickness of the DLC film increases, the color of the film gradually becomes brown (or yellow) and its transmissivity is lowered. On the other hand, if the DLC film is excessively thin, uniform film formation is difficult. Also, the effect that charges of static electricity are discharged, can not be expected very much. Thus, in this embodiment, the thickness of the DLC film is made 5 to 100 nm.

Further, as the insulating substrate, it is preferable to use a quartz substrate than a glass substrate. This is due to the following reason.

The glass substrate is heated up to a high temperature in subsequent manufacturing steps of the TFT, such as a step of crystallizing an amorphous silicon film or a step of forming an insulating film. However, in these steps, since the substrate is heated up to a temperature near the distortion point temperature (600° C.) of the glass substrate, the glass substrate shrinks. The DLC film is a very hard film as described above. Accordingly, there is the possibility that the DLC film is cracked or peeled off when the glass substrate shrinks.

On the other hand, since the temperature of distortion point of the quartz substrate is 1,000° C. or more, it hardly shrinks in the TFT manufacturing steps.

Further, for the purpose of improving the adhesiveness between the insulating substrate 101 and the DLC film 102, it is appropriate that a buffer layer is provided between the insulating substrate 101 and the DLC film 102. As the buffer layer, a silicon film, a silicon carbide film, a silicon nitride film, or the like is preferably used. The thickness of the buffer layer is made 80 to 200 nm.

Then, a semiconductor film 103 is formed on the insulating substrate 101. As the semiconductor film, it is appropriate that an amorphous silicon film, a polycrystalline silicon film, or the like is used. An underlayer film such as a silicon oxide film or a silicon nitride film may preferably be formed on the insulating substrate 101 before the semiconductor film 103 is formed.

Next, a gate insulating film 104 and a gate electrode 105 are formed on the semiconductor film 103. Thereafter, impurities are implanted in the semiconductor film to form a source region 106 and a drain region 107. A channel forming region is formed at a portion 108.

Next, a first interlayer insulating film 109 is formed to cover the gate insulating film 104 and the gate electrode 105. Contact holes are formed in the gate insulating film 104 and the first interlayer insulating film 109, and a source electrode 110 and a drain electrode 111 are formed. In this way, a TFT is formed (FIG. 1B).

A second interlayer insulating film 112 is formed to cover the TFT, and a light shielding film 113 is formed on the second interlayer insulating film above the TFT. After a third interlayer insulating film 114 is formed, a pixel electrode 115 made of a transparent conductive film such as ITO is formed (FIG. 1C). A well-known method may be used as a manufacturing method thereof.

Then the liquid crystal display is completed by a well-known method.

Embodiment 2

Figure 2A:
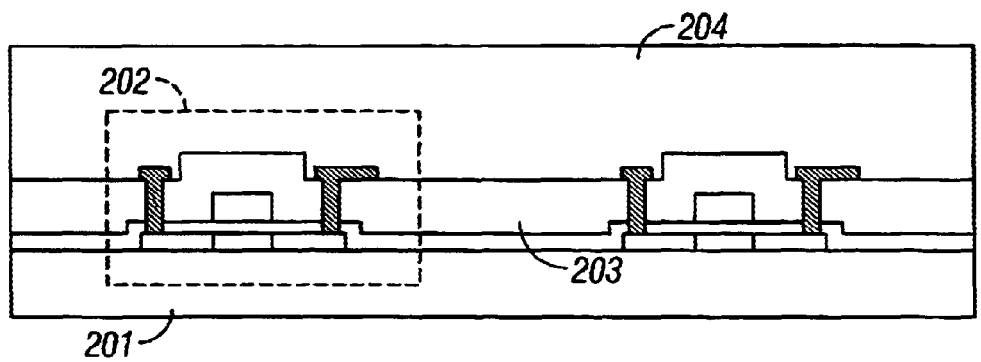
FIGS. 2A to 2C are views showing manufacturing steps of an active matrix circuit of the present invention.
Figure 2B:
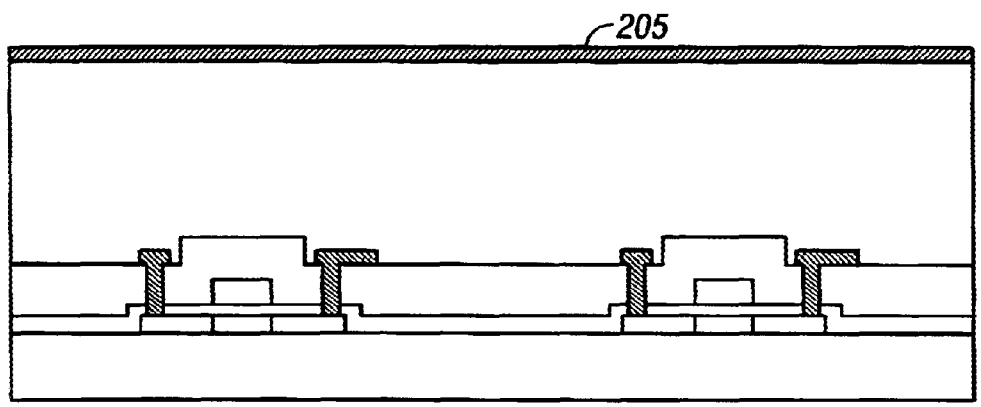
Figure 2C:
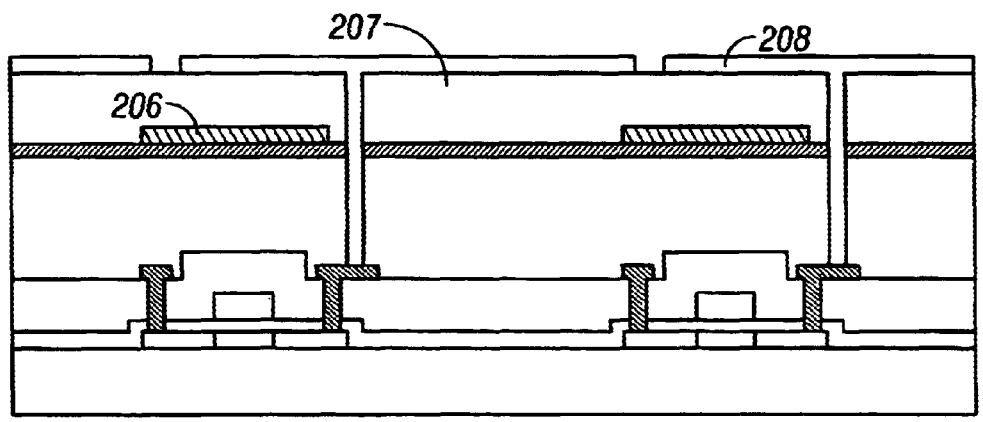

In this embodiment, a transmission type liquid crystal display having another structure according to the present invention will be described with reference to FIGS. 2A to 2C. FIGS. 2A to 2C are sectional views of an active matrix circuit portion.

First, as shown in FIG. 2A, in the same way as in Embodiment 1, a TFT 202 is formed on an insulating substrate 201. Reference numeral 203 denotes a first interlayer insulating film. A second interlayer insulating film 204 is formed to cover the TFT 202. Then, a DLC film 205 with a thickness of 5 to 100 nm is formed on the second interlayer insulating film 204 (FIG. 2B).

At this time, it is appropriate that an organic resin film is used for the second interlayer insulating film 204. This is because both organic resin film and DLC film are made of carbon-based materials so that the adhesiveness between them is excellent. Therefore, the DLC film is hard to peel off from the organic resin film. As the organic resin film, polyimide, polyamide, polyimide amide, acryl, and the like can be enumerated.

Then, a light shielding film 206 is formed on the DLC film 205, and further, a third interlayer insulating film 207 is formed thereon. As the light shielding film 206, it is possible to use an organic resin film (hereinafter referred to as a black resin film) dispersed with black pigments or graphite, a conductive film (typically, a metal film of titanium, chromium, aluminum, or the like) having a light-shielding property, or the like. Especially, since the black resin has excellent adhesiveness to the DLC film, it is preferable to use the black resin film.

Then, a contact hole is formed, and a pixel electrode 208 is formed using a transparent conductive film of ITO or the like (FIG. 2C). When the contact hole is formed, the DLC film 205 can be etched by an oxygen plasma, hydrogen plasma, ion milling, or the like.

Further, the liquid crystal display is completed by using a well-known method.

Like this, even when the structure in which the DLC film 205 is provided over the TFT 202 is used, it is possible to prevent electrostatic breakdown of the TFT from occurring.

Embodiment 3

In Embodiments 1 and 2, although the explanation has been made on the transmission type liquid crystal display, the present invention can be applied to a reflection type liquid crystal display in the same way. It is appropriate that a conductive film having light-reflecting properties, such as a film of aluminum or a material containing aluminum as its main ingredient, is used for a pixel electrode.

In case of the reflection type liquid crystal display, it is not necessary to consider the transmissivity of a DLC film. Accordingly, it is possible to thicken the film to such a degree that the film is not peeled off. As a result, effect that charges of static electricity are discharged, can be enhanced. Practically, it is appropriate that the thickness is made 50 to 200 nm (preferably 100 to 150 nm).

Embodiment 4

In Embodiment 1, the explanation has been made on the case where the DLC film is provided on the surface of the substrate opposite to the surface on which the TFT is formed. In this embodiment, a case where a DLC film is provided on a surface on which a TFT is formed will be described. FIG. 3 is a sectional view of an active matrix circuit portion of this embodiment.

First, a DLC film 302 is formed on an insulating substrate 301 in the same way as in Embodiment 1. The thickness of the DLC film 302 is made 5 to 100 nm. In the case where a reflection type liquid crystal display is manufactured, the thickness thereof is made 50 to 200 nm (preferably 100 to 150 nm).

At this time, for the purpose of improving the adhesiveness between the substrate 301 and the DLC film 302, a buffer layer of a silicon film, a silicon carbide film, or a silicon nitride film may be provided therebetween. The thickness of the buffer layer is set as 80 to 200 nm. In view of a heat treatment in the subsequent manufacturing steps of a TFT, it is preferable to use a quartz substrate than a glass substrate as the insulating substrate.

Next, as an underlayer film 303, an insulating film such as a silicon oxide film or a silicon nitride film is formed on the DLC film 302. Then, a TFT 304 is formed on the underlayer film 303 by using a well-known method.

Like this, even if the structure of this embodiment is used, it is possible to prevent electrostatic breakdown from occurring during the manufacture of a liquid crystal display or during the use.

Embodiment 5

In this embodiment, a structure of a liquid crystal display in which an active matrix circuit and a driver circuit are provided on the same substrate, will be described. FIG. 4 shows the structure of a substrate including an active matrix circuit and a driver circuit.

An active matrix circuit 402, a gate driver circuit 403, a source driver circuit 404, and a logic circuit 405 are formed on an insulating substrate 401. The driver circuit is constituted by CMOS circuits in which an N-channel TFT and a P-channel TFT are complementarily combined. The logic circuit 405 is a signal processing circuit for carrying out a process such as conversion or correction of an image signal. Specifically, the circuit includes an A/D converter circuit, a γ-correction circuit, and a memory circuit, which are also constituted by TFTs.

A DLC film 406 is formed on a surface of the insulating substrate 401 opposite to the surface on which the circuits are formed. This DLC film 406 can prevent electrostatic breakdown of not only TFTs of the active matrix circuit but also TFTs of the gate driver circuit 403, the source driver circuit 404, and the logic circuit 405.

It should be noted that the DLC film 406 may be provided over the TFT as in Embodiment 2 or may be provided between the TFT and the insulating substrate as in Embodiment 4.

Embodiment 6

The structure of the present invention can be applied to various electro-optical devices and semiconductor circuits other than the liquid crystal display.

As the electro-optical devices other than the liquid crystal display, an EL (electroluminescence) device, an image sensor, and the like can be enumerated. As the semiconductor circuits, there are exemplified a computation processing circuit such as a microprocessor constituted by an IC chip, a high frequency module (MMIC, etc.) for processing input and output signals of a portable equipment, and the like.

Like this, the present invention can be applied to any semiconductor device functioning with a semiconductor circuit constituted by TFTs.

Embodiment 7

CMOS circuits and pixel active matrix circuits produced by the embodiments of the present invention can be applied to a plurality of electro-optical devices (e.g. an active matrix type liquid crystal display, an active matrix type EL display, and an active matrix type EC display). That is, the present invention can be carried out for all the electric apparatus including such the electro-optical devices as display media.

As such electronic apparatus, a video camera, a digital camera, a projector (rear type or front type), a head mount display (a goggle type display), a car navigation system, a personal computer, a portable information terminal (mobile computer, portable telephone, electric book, etc.) and the like are enumerated. Examples of those are shown in FIGS. 5A to 5F, 6A to 6D, and 7A to 7C.

FIG. 5A shows a personal computer which is constituted by a main body 2001, an image input portion 2002, a display device 2003, and a keyboard 2004. The present invention can be applied to the image input portion 2002, the display device 2003, and other signal control circuits.

FIG. 5B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 5C:
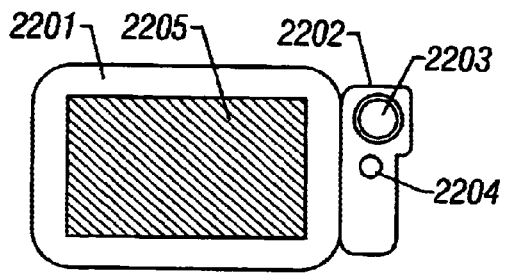

FIG. 5C shows a mobile computer which is constituted by a main body 2201, a camera portion 2202, an image receiving portion 2203, an operation switch 2204, and a display device 2205. The present invention can be applied to the display device 2205 and other is signal control circuits.

Figure 5D:
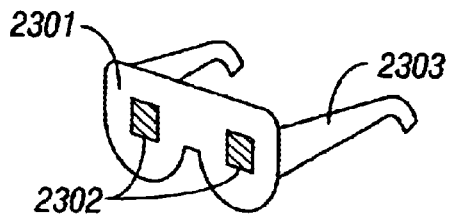

FIG. 5D shows a goggles-type display which is constituted by a main body 2301, a display device 2302, and an arm portion 2303. The present invention can be applied to the display device 2302 and other signal control circuits.

Figure 5E:
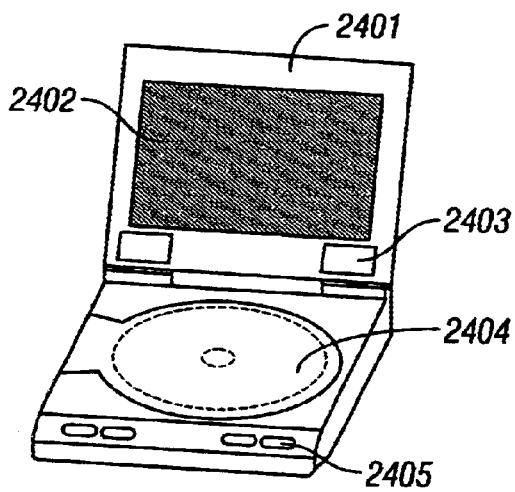

FIG. 5E shows a player apparatus which is equipped with a recording medium for recording a program (hereinafter, called "a recording medium"). The player apparatus is constituted by a main body 2401, a display device 2402, a speaker portion 2403, a recording medium 2404, an operation switch 2405 and an eternal input portion 2406. This apparatus includes a DVD (digital Versatile Disc), a CD and the like as the recording medium for appreciating music and movie, playing a game, and Internet. The present invention can be applied to the display device 2402 and other signal control circuits.

Figure 5F:
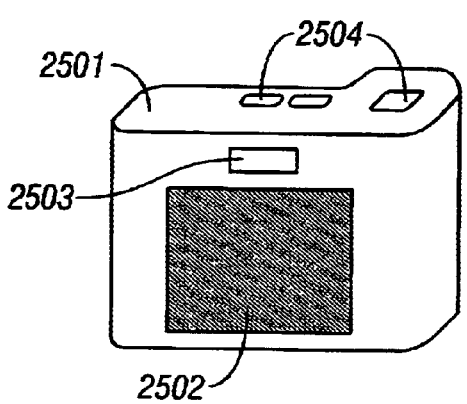

FIG. 5F shows a digital camera which is constituted by a main boy 2501, a display device 2502, an eyepiece portion 2503, an operation switch 2504 and an image receiving portion (not shown). The present invention can be applied to the display device 2502 and lo other signal control circuits.

Figure 6A:
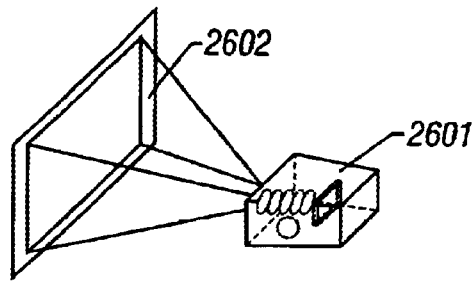

FIG. 6A shows a front type projector which is constituted by a light source optical system and a display device 2601, and a screen 2602. The present invention can be applied to the display device and other signal control circuits.

Figure 6B:
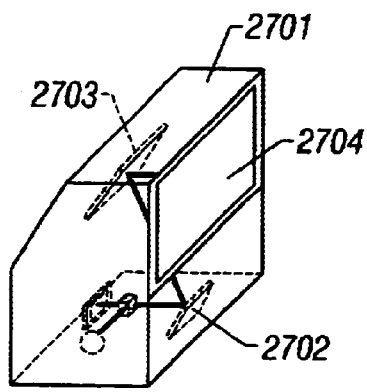

FIG. 6B shows a rear type projector which is constituted by a main body 2701, a light source optical system and a display device 2702, a mirror 2703 and a screen 2704. The present invention can be applied to the display device and other signal control circuits.

Figure 6C:
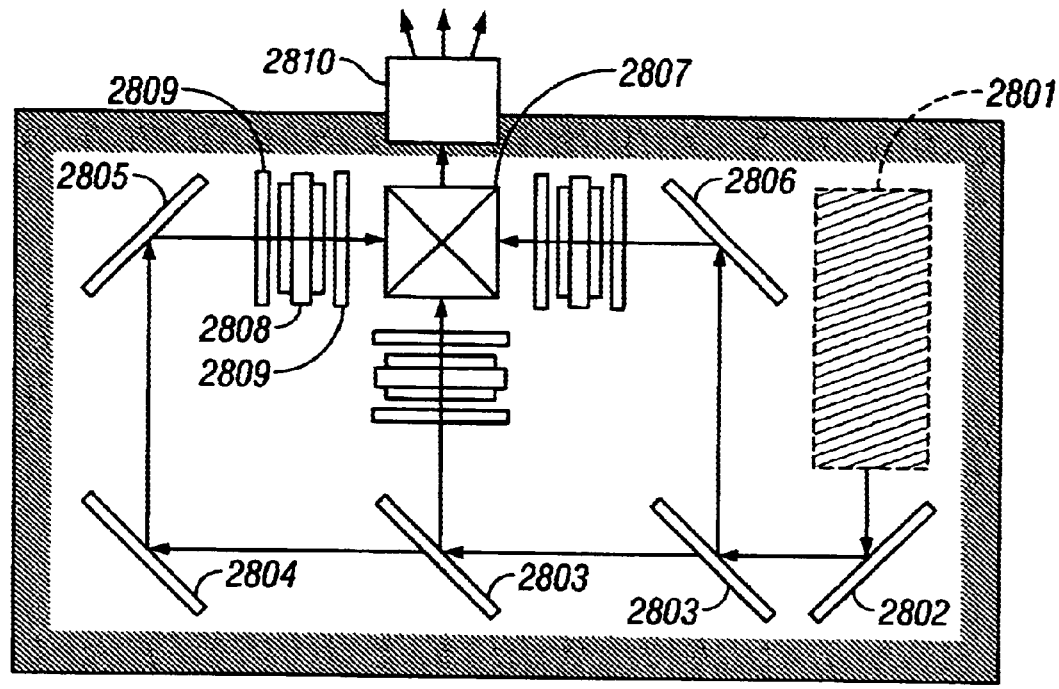

FIG. 6C shows an example structure of a light source optical system and a display device 2601 in FIG. 6A, or 2702 in FIG. 6B. Each of numerals 2601 and 2702 includes a light source optical system 2801, mirrors 2802, 2804–2806, a dichroic mirror 2803, another optical system 2807, a display device 2808, a phase difference plate 2809, and a projection optical system 2810. The projection optical system 2810 is constituted by a plurality of optical lenses equipped with a projection lens. Such a projection system as shown in FIG. 6C is called a three-plate type since this structure includes three plates of display devices. Further, it is proper for a researcher to form, in an optical path indicated by an arrow in FIG. 6C, an optical lens, a film with a polarizing characteristics, a film to control a phase difference, an IR film, etc.

Figure 6D:
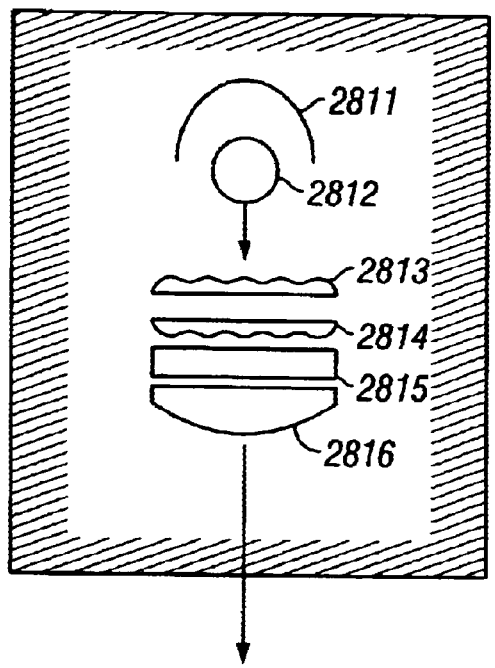

FIG. 6D shown an example structure of a light source optical system 2801 in FIG. 6C. In this embodiment, the light source optical system 2801 includes a reflector 2811, a light source 2812, lens arrays 2813 and 2814, a polarizing conversion element 2815 and a condenser lens 2816. However, the present invention is not specifically limited by this embodiment because it is just an example. For example, in an optical path, an optical lens, a film with a polarizing characteristics, a film to control a phase difference, an IR film, etc. can be properly formed.

Figure 7A:
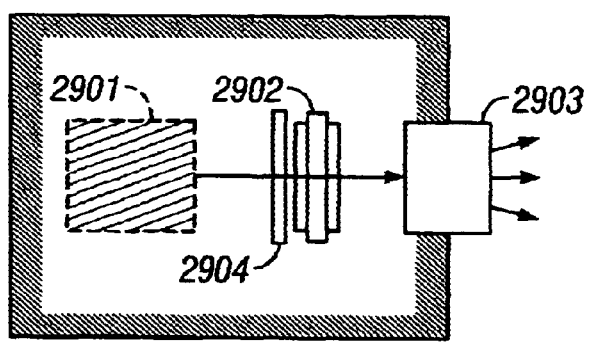

While FIG. 6C shows an example of the three-plate type, FIG. 7A shows an example of single-plate type. A light source optical system 2901, a display device 2902, a projection optical system 2903 are included in a light source optical system and a display device shown in FIG. 7A. It is possible to apply the light source optical system and display device shown in FIG. 7A to the light source optical system and display device 2601 shown in FIG. 6A, or 2702 in FIG. 6B. Further, the light source optical system 2901 can be applied by the light source optical system shown in FIG. 6D. In addition, the display device 2902 is equipped with a color filter (not shown), so that display image is colored.

Figure 7B:
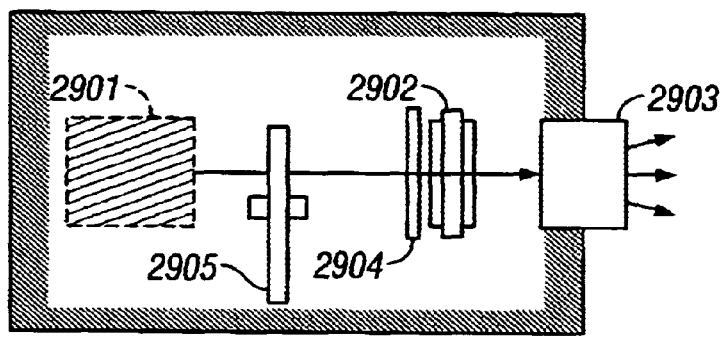

FIG. 7B shows an applied example of a light source optical system and a display device which is applied by FIG. 7A. Instead of forming a color filter, a display image is colored by RGB rotary color filter disc 2905. It is possible to apply the light source optical system and display device shown in FIG. 7B to the light source optical system and display device 2601 shown in FIG. 6A, or 2702 in FIG. 6B.

Figure 7C:
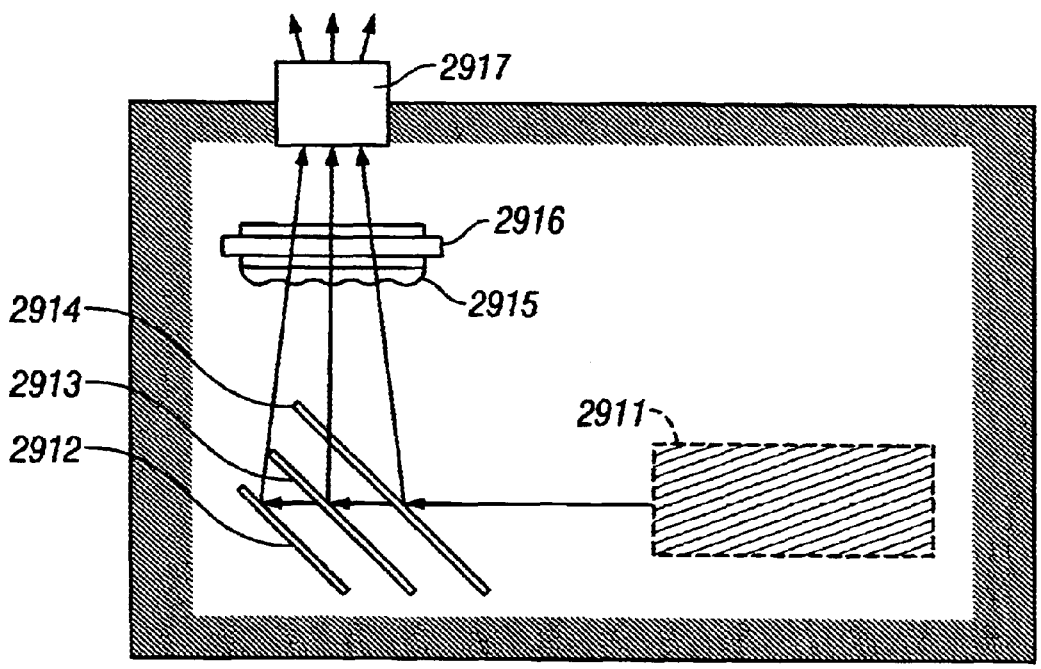

A structure of the light source optical system and display device, as shown in FIG. 7C is called as a color-fileterless single-plate type. In this structure, a display device 2916 is equipped with a microlens array 2915, and a display image is colored by a dichroic mirror (Green) 2912, a dichroic mirror (Red) 2913 and a dichroic mirror (Blue). A projection optical system 2917 is constituted by a plurality of lenses including a projection lens. It is possible to apply the light source optical system and display device shown in FIG. 7C to the light source optical system and display device 2601 shown in FIG. 6A, or 2702 in FIG. 6B. Further, as the light source optical system 2911, an optical system having a coupling lens and a collimating lens other than a light source can be applied.

As described above, the present invention can be applied in a large range, so that it is possible to apply to any electric apparatus in every field. In addition, the electric apparatus in the instant invention can be realized by using any structure combined with Embodiments.

According to the structure of the present invention, it is possible to free the substrate of charges of static electricity, so that electrostatic breakdown of a TFT can be prevented from occurring. Thus, it is possible to realize a highly reliable electro-optical device, a semiconductor circuit, and an electronic equipment including them.

What is claimed is:

1. A semiconductor device comprising:
    a thin film transistor formed over an insulating surface;
    a first insulating film formed over the thin film transistor;
    a second insulating film formed on the first insulating film;
    a diamond-like carbon film formed on the second insulating film;
    a third insulating film formed over the diamond-like carbon film; and
    a pixel electrode formed on the third insulating film.

2. A device according to claim 1, wherein the second insulating film comprises organic resin.

3. A device according to claim 2, wherein the second insulating film is selected from the group consisting of polyimide, polyamide, polyimide amide, and acryl.

4. A device according to claim 1, wherein the substrate is a quartz substrate.

5. A device according to claim 1, wherein the diamond-like carbon film has a specific resistance $10^7$ to $10^{14}$ $\Omega$cm.

6. A device according to claim 1, wherein said semiconductor device is an active matrix type display device having a pixel region and a driver region on the substrate.

7. A device according to claim 1, wherein said semiconductor device is used for an electronic device selected from the group consisting of a personal computer, a video camera, a mobile computer, a goggles-type display, a player apparatus comprising a recording medium, a digital camera, a front type projector, and a rear type projector.

8. A device according to claim 1, wherein the diamond-like carbon film has Vickers hardness of 2,000 to 5,000 kgf/mm$^2$.

9. A device according to claim 1, wherein the diamond-like carbon film has a thickness of 5 to 100 nm.

10. A device according to claim 1, wherein the diamond-like carbon film has a thickness of 50 to 200 nm.

11. A device according to claim 1, wherein the pixel electrode comprises a transparent conductive film.

12. A device according to claim 1, wherein the pixel electrode comprises a conductive film having light-reflecting properties.

13. A method of manufacturing a semiconductor device, comprising the steps of:
    forming a thin film transistor over an insulating surface;
    forming a first insulating film over the thin film transistor;
    forming a second insulating film on the first insulating film;
    forming a diamond-like carbon film on the second insulating film;

forming a third insulating film over the diamond-like carbon film; and forming a pixel electrode on the third insulating film.

14. A method according to claim 13, wherein the second insulating film comprises organic resin.

15. A method according to claim 14, wherein the second insulating film is selected from the group consisting of polyimide, polyamide, polyimide amide, and acryl.

16. A method according to claim 13, wherein the substrate is a quartz substrate.

17. A method according to claim 13, wherein the diamond-like carbon film has a specific resistance $10^7$ to $10^{14}$ Ωcm.

18. A method according to claim 13, wherein said semiconductor device is an active matrix type display device having a pixel region and a driver region on the substrate.

19. A method according to claim 13, wherein said semiconductor device is used for an electronic device.selected from the group consisting of a personal computer, a video camera, a mobile computer, a goggles-type display, a player apparatus comprising a recording medium, a digital camera, a front type projector, and a rear type projector.

20. A method according to claim 13, wherein the diamond-like carbon film has Vickers hardness of 2,000 to 5,000 kgf/mm$^2$.

21. A method according to claim 13, wherein the diamond-like carbon film has a thickness of 5 to 100 nm.

22. A method according to claim 13, wherein the diamond-like carbon film has a thickness of 50 to 200 nm.

23. A method according to claim 13, wherein the pixel electrode comprises a transparent conductive film.

24. A method according to claim 13, wherein the pixel electrode comprises a conductive film having light-reflecting properties.

25. An electronic device comprising:

a thin film transistor formed over an insulating surface;

a first insulating film formed over the thin film transistor;

a second insulating film formed on the first insulating film;

a diamond-like carbon film formed on the second insulating film;

a third insulating film formed over the diamond-like carbon film; and a pixel electrode formed on the third insulating film.

26. A device according to claim 25, wherein the second insulating film comprises organic resin.

27. A device according to claim 26, wherein the second insulating film is selected from the group consisting of polyimide, polyamide, polyimide amide, and acryl.

28. A device according to claim 25, wherein the substrate is a quartz substrate.

29. A device according to claim 25, wherein the diamond-like carbon film has a specific resistance $10^7$ to $10^{14}$ Ωcm.

30. A device according to claim 25, wherein said electronic device comprises an active matrix type display device having a pixel region and a driver region on the substrate.

31. A device according to claim 25, wherein said electronic device is selected from the group consisting of a personal computer, a video camera, a mobile computer, a goggles-type display, a player apparatus comprising a recording medium, a digital camera, a front type projector, and a rear type projector.

32. A device according to claim 25, wherein the diamond-like carbon film has Vickers hardness of 2,000 to 5,000 kgf/mm$^2$.

33. A device according to claim 25, wherein the diamond-like carbon film has a thickness of 5 to 100 nm.

34. A device according to claim 25, wherein the diamond-like carbon film has a thickness of 50 to 200 nm.

35. A device according to claim 25, wherein the pixel electrode comprises a transparent conductive film.

36. A device according to claim 25, wherein the pixel electrode comprises a conductive film having light-reflecting properties.

37. A method of manufacturing an electronic device, comprising the steps of:

forming a thin film transistor over an insulating surface;

forming a first insulating film over the thin film transistor;

forming a second insulating film on the first insulating film;

forming a diamond-like carbon film on the second insulating film;

forming a third insulating film over the diamond-like carbon film; and forming a pixel electrode on the third insulating film.

38. A method according to claim 37, wherein the second insulating film comprises organic resin.

39. A method according to claim 38, wherein the second insulating film is selected from the group consisting of polyimide, polyamide, polyimide amide, and acryl.

40. A method according to claim 37, wherein the substrate is a quartz substrate.

41. A method according to claim 37, wherein the diamond-like carbon film has a specific resistance $10^7$ to $10^{14}$ Ωcm.

42. A method according to claim 37, wherein said electronic device comprises an active matrix type display device having a pixel region and a driver region on the substrate.

43. A method according to claim 1, wherein said electronic device is selected from the group consisting of a personal computer, a video camera, a mobile computer, a goggles-type display, a player apparatus comprising a recording medium, a digital camera, a front type projector, and a rear type projector.

44. A method according to claim 37, wherein the diamond-like carbon film has Vickers hardness of 2,000 to 5,000 kgf/mm$^2$.

45. A method according to claim 37, wherein the diamond-like carbon film has a thickness of 5 to 100 nm.

46. A method according to claim 37, wherein the diamond-like carbon film has a thickness of 50 to 200 nm.

47. A method according to claim 37, wherein the pixel electrode comprises a transparent conductive film.

48. A method according to claim 37, wherein the pixel electrode comprises a conductive film having light-reflecting properties.

49. A semiconductor device comprising:

a thin film transistor formed over an insulating surface;

an insulating film formed over the thin film transistor;

a diamond-like carbon film formed on the insulating film;

a light shielding film formed on the diamond-like carbon film; and a pixel electrode formed over the light shielding film.

50. A device according to claim 49, wherein the insulating film comprises organic resin.

51. A device according to claim 50, wherein the insulating film is selected from the group consisting of polyimide, polyamide, polyimide amide, and acryl.

52. A device according to claim 49, wherein the substrate is a quartz substrate.

53. A device according to claim 49, wherein the diamond-like carbon film has a specific resistance $10^7$ to $10^{14}$ Ωcm.

54. A device according to claim 49, wherein the diamond-like carbon film has Vickers hardness of 2,000 to 5,000 kgf/mm$^2$.

55. A device according to claim 49, wherein said semiconductor device is an active matrix type display device having a pixel region and a driver region on the substrate.

56. A device according to claim 49, wherein said semiconductor device is used for an electronic device selected from the group consisting of a personal computer, a video camera, a mobile computer, a goggles-type display, a player apparatus comprising a recording medium, a digital camera, a front type projector, and a rear type projector.

57. A method of manufacturing a semiconductor device, comprising the steps of:

forming a thin film transistor over an insulating surface;

forming an insulating film over the thin film transistor;

forming a diamond-like carbon film on the insulating film;

forming light shielding film formed on the diamond-like carbon film; and forming a pixel electrode over the light shielding film.

58. A method according to claim 57, wherein the insulating film comprises organic resin.

59. A method according to claim 58, wherein the insulating film is selected from the group consisting of polyimide, polyamide, polyimide amide, and acryl.

60. A method according to claim 57, wherein the substrate is a quartz substrate.

61. A method according to claim 57, wherein the diamond-like carbon film has a specific resistance $10^7$ to $10^{14}$ Ωcm.

62. A method according to claim 57, wherein the diamond-like carbon film has Vickers hardness of 2,000 to 5,000 kgf/mm$^2$.

63. A method according to claim 57, wherein said semiconductor device is an active matrix type display device having a pixel region and a driver region on the substrate.

64. A method according to claim 57, wherein said semiconductor device is used for an electronic device selected from the group consisting of a personal computer, a video camera, a mobile computer, a goggles-type display, a player apparatus comprising a recording medium, a digital camera, a front type projector, and a rear type projector.

* * * * *